(12) United States Patent
Kuekes

(10) Patent No.: US 6,870,394 B2
(45) Date of Patent: *Mar. 22, 2005

(54) CONTROLLED INPUT MOLECULAR CROSSBAR LATCH

(75) Inventor: Philip J. Kuekes, Menlo Park, CA (US)

(73) Assignee: Hewlett-Packard Development, L.P., Houston, TX (US)

( * ) Notice: Subject to any disclaimer, the term of this patent is extended or adjusted under 35 U.S.C. 154(b) by 119 days.

This patent is subject to a terminal disclaimer.

(21) Appl. No.: 10/355,591

(22) Filed: Jan. 31, 2003

(65) Prior Publication Data

US 2003/0173595 A1 Sep. 18, 2003

Related U.S. Application Data

(63) Continuation-in-part of application No. 10/016,593, filed on Oct. 29, 2001, now Pat. No. 6,586,965.

(51) Int. Cl.[7] .............................................. H03K 19/177
(52) U.S. Cl. .......................................... 326/41; 326/38
(58) Field of Search .............................. 326/37–41, 101

(56) References Cited

U.S. PATENT DOCUMENTS

| 5,206,939 | A | 4/1993 | Yanai et al. | |
|---|---|---|---|---|
| 5,778,394 | A | 7/1998 | Galtzur et al. | |
| 5,845,147 | A | 12/1998 | Vishlitzky et al. | |
| 5,857,208 | A | 1/1999 | Ofek | |
| 6,128,214 | A | 10/2000 | Kuekes et al. | 365/151 |
| 6,256,767 | B1 * | 7/2001 | Kuekes et al. | 716/9 |
| 6,259,277 | B1 * | 7/2001 | Tour et al. | 326/136 |
| 6,314,019 | B1 | 11/2001 | Kuekes et al. | 365/151 |
| 6,331,788 | B1 * | 12/2001 | Lyke | 326/39 |
| 6,459,095 | B1 | 10/2002 | Heath et al. | 275/14 |

OTHER PUBLICATIONS

U.S. Appl. No. 09/282,045, "Molecular Wire Crossbar Logic (MWCL)", filed Mar. 29, 1999.

U.S. Appl. No. 09/431,758, filed Nov. 1, 1999, Murphy et al.

* cited by examiner

Primary Examiner—Don Le

(57) ABSTRACT

A molecular crossbar latch is provided, comprising two control wires and a signal wire that crosses the two control wires to form a junction with each control wire. The latch further includes a control mechanism for controllably electrically connecting and disconnecting signal input to the latch, thus allowing the input to change its logic value after the signal is latched while the signal wire retains its latched value. Each junction forms a switch, the junction having a functional dimension in nanometers. The crossbar latch permits latching a logic value on the signal wire. Further, methods are provided for latching logic values in a logic array, for inverting a logic value, and for restoring a voltage value of a signal in a nano-scale wire.

54 Claims, 7 Drawing Sheets

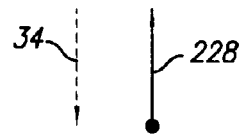
FIG. 5a   FIG. 5b
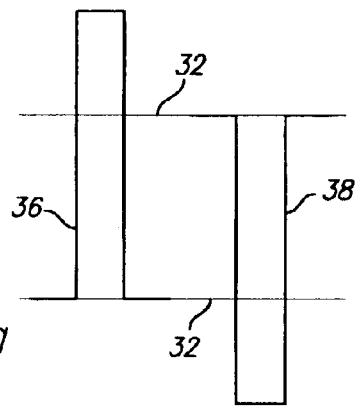
FIG. 6
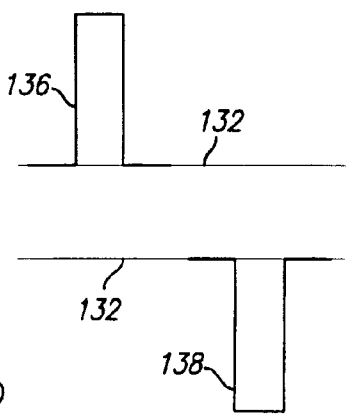
FIG. 6a
FIG. 6b

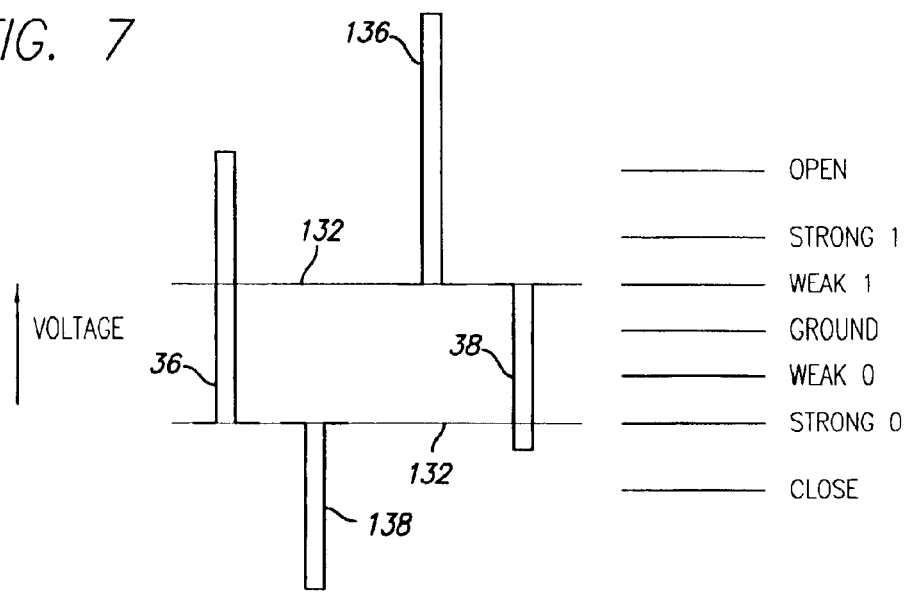
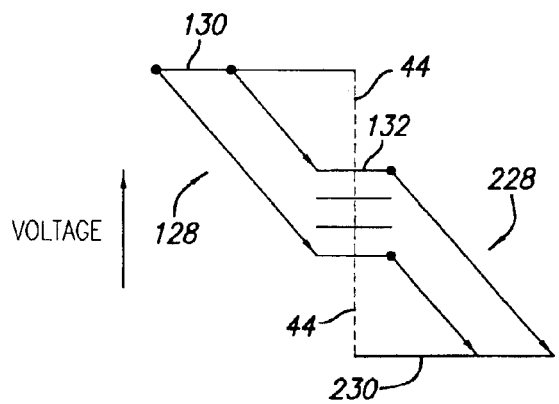 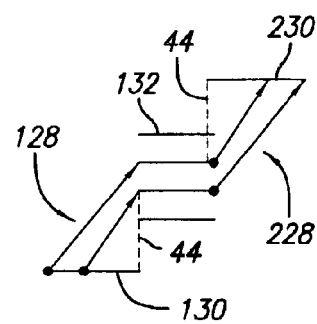
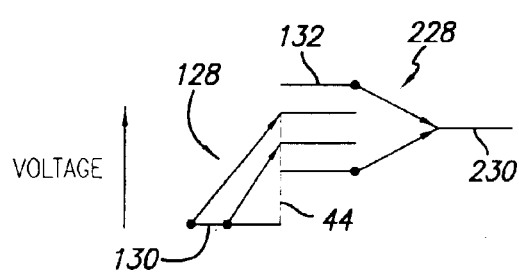 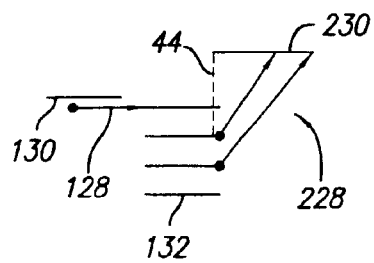

US 6,870,394 B2

CONTROLLED INPUT MOLECULAR CROSSBAR LATCH

CROSS-REFERENCE TO RELATED APPLICATION

The present application is a continuation-in-part of application Ser. No. 10/016,593, filed Oct. 29, 2001, now U.S. Pat. No. 6,586,965, issued Jul. 1, 2003. +gi

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Contract No. MDA972-01-30005 awarded by the Defense Advanced Research Projects Agency.

TECHNICAL FIELD

The present invention is related generally to electronic devices whose functional length scales are measured in nanometers, and, more particularly, to a latch for use with crossbar arrays based on crossed nanometer-scale wires joined by voltage-settable switches at the intersecting junctions.

BACKGROUND ART

Nano-computing is based on the premise of switches that are of nanometer scale in the functional dimension(s). Examples of technology used in implementing nano-scale switches are disclosed and claimed in the following: U.S. Pat. No. 6,459,095, entitled "Chemically Synthesized and Assembled Electronic Devices", issued to James R. Heath et al on Oct. 1, 2002; U.S. Pat. No. 6,314,019, entitled "Molecular Wire Crossbar Interconnect (MWCI) for Signal Routing and Communications", issued to Philip J. Kuekes et al on Nov. 6, 2001; application Ser. No. 09/280,045, entitled "Molecular Wire Crossbar Logic (MWCL)", filed on Mar. 29, 1999, in the names of Philip J. Kuekes et al; U.S. Pat. No. 6,128,214, entitled "Molecular Wire Crossbar Memory", issued to Philip J. Kuekes et al on Oct. 3, 2000; and U.S. Pat. No. 6,256,767, entitled "Demultiplexer for a Molecular Wire Crossbar Network", issued to Philip J. Kuekes et al on Jul. 3, 2001, all assigned to the same assignee as the present application.

To have fully general computing, one must have not only logic functions and memory functions, but we must be able to take a logical variable and put it into a memory and be able to reuse it as the input to another logic function. This allows one to build finite state machines and thus do completely general computing. One method of doing this is to use a latch.

While such a latch is well-known in the art of general computing, as that art has developed in the year 2003, advances in the art of nano-computing require new approaches to developing a latching functionality at the nanometer scale.

Thus, what is needed is a latch that is specifically configured for nanometer-scale computing and is compatible in size with nanometer scale logic.

DISCLOSURE OF INVENTION

In accordance with the present invention, a molecular crossbar latch comprising two control wires and a signal wire that crosses the two control wires at a non-zero angle to thereby form a junction with each control wire. Each junction forms a switch and each junction has a functional dimension in nanometers. The signal wire selectively has at least two different voltage states, ranging from a 0 state to a 1 state, wherein there is an asymmetry with respect to the direction of current flow from the signal wire through one junction compared to another junction such that current flowing through one junction into or out of the signal wire can open or close, respectively, the switch, while current flowing through the other junction out of or into the signal wire can close or open, respectively, the switch, and wherein there is a voltage threshold for switching between an open switch and a closed switch. The latch further includes a control mechanism for controllably electrically connecting and disconnecting signal input to the latch, thus allowing the input to change its logic value after the signal is latched while the signal wire retains its latched value.

Further, a molecular crossbar latch is provided, comprising two control wires, a gate wire, an input control circuit, and an signal wire that crosses the two control wires at a non-zero angle to thereby form a junction with each control wire. The input control circuit has a controllable electrical connection to the signal wire such that the voltage on the gate wire determines if the input is electrically connected to the signal wire or not electrically connected to the signal wire. Each junction of the signal wire and the two control wires forms a switch and the junction has a functional dimension in nanometers. The signal wire selectively has at least two different voltage states, ranging from a 0 state to a 1 state, wherein there is an asymmetry with respect to the direction of current flow from the signal wire through one junction compared to another junction such that current flowing through one junction into (out of) the signal wire can open (close) the first switch while current flowing through the other junction out of (into) the signal wire can close (open) the other switch, and wherein there is a voltage threshold for switching between an open switch and a closed switch, thereby latching a signal on the signal wire and creating a logic value, with the input control circuit controlled by the gate wire, thus allowing the input to change its logic value after the signal is latched while the signal wire retains its latched value.

A method is provided for latching logic values onto nanowires in a logic array. The method comprises:
  providing the molecular crossbar latch; and
  applying a sequence of voltages to the two control wires that results in setting the switches of the two junctions such that either the first switch is open and the second switch is closed if the signal wire had a voltage representing a logic 1, or the first switch is closed and the second switch is open if the signal wire had a voltage representing a logic 0, thereby latching the signal.

Secondly, a method is provided for restoring a voltage value of a signal in a nano-scale switch. The method comprises:
  providing the molecular crossbar latch;
  latching the signal as above; and
  placing a voltage representing logic 0 on the first control wire and a voltage representing logic 1 on the second control wire.

Finally, a method is provided for inverting a voltage value of a signal in a nano-scale switch. The method comprises:
  providing the molecular crossbar latch;
  latching the signal as above; and placing a voltage representing logic 1 on the first control wire and a voltage representing logic 0 on the second control wire.

No latch has previously been demonstrated at the nanometer scale. The present invention allows a nanometer scale latch to be both constructed and integrated with other circuits using the crossbar. Further, the present invention provides at a nanometer scale: latching of an arbitrary logic signal, restoration of logic signal strength, possible inversion of the latched output, and multiple latches with very few clocking connections to outside circuits. The combination of the proceeding features allows the construction of arbitrarily complex logic designs.

BRIEF DESCRIPTION OF THE DRAWINGS

FIGS. 5a–5b are each a schematic representation of an asymmetric switch in the open (FIG. 5a) and closed (FIG. 5b) positions, as applied to the embodiments disclosed herein;

FIG. 6, on a vertical scale in volts, depicts the voltage levels involved in going from a voltage representation to a switch representation for the operation of a latch in accordance with the present invention;

FIG. 6a, on a vertical scale in volts, depicts an unconditional open pulse and an unconditional close pulse in the practice of the present invention;

FIG. 6b, on a vertical scale in volts, depicts a conditional open pulse and a conditional close pulse employed in the practice of the present invention;

FIG. 7, on a vertical scale in volts, depicts the pulse sequence to latch a bit in the practice of the present invention;

FIGS. 8a–8b, each on a vertical scale in volts, show the voltage levels on the latch of FIG. 4 to unconditionally open both switches (FIG. 8a) or to conditionally close one or the other switch simultaneously (FIG. 8b);

FIGS. 9a–9b, each on a vertical scale in volts, show the voltage levels on the latch of FIG. 4 to conditionally close one switch and then the other switch sequentially as an alternative to the embodiment depicted in FIG. 8b;

BEST MODES FOR CARRYING OUT THE INVENTION

Definitions

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM) or a color pixel in a display.

The term "bi-stable" as applied to a molecule means a molecule having two relatively low energy states separated by an energy (or activation) barrier. The molecule may be either irreversibly switched from one state to the other (singly configurable) or reversibly switched from one state to the other (re-configurable).

Micron-scale dimensions refer to dimensions that range from 1 micrometer to a few micrometers in size.

Sub-micron scale dimensions refer to dimensions that range from 1 micrometer down to 0.05 micrometers.

Nanometer scale dimensions refer to dimensions that range from 0.1 nanometers to 50 nanometers (0.05 micrometers).

Micron-scale and submicron-scale wires refer to rod or ribbon-shaped conductors or semiconductors with widths or diameters having the dimensions of 0.05 to 10 micrometers, heights that can range from a few tens of nanometers to a micrometer, and lengths of several micrometers and longer.

As used herein, the term "electrically connected" means that the voltage on one side of the connection can significantly (in terms of logic function) influence the voltage on the other side of the connection.

Present Invention

The present invention allows one to build latches from crossbar switches. Crossbar switches are disclosed in the above-listed patent applications and issued patents.

Figure 1:
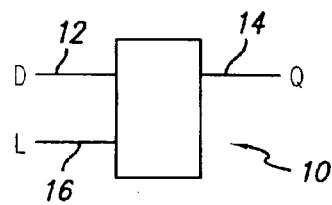
FIG. 1 is a schematic drawing, depicting the logical function of a conventional latch.

FIG. 1 shows the logical function of a latch 10. There is an input D 12, an output Q 14, and a latch control L 16, such that the state of L determines whether Q is the same logical value as D (L=0) or if L=1, then Q retains the value of D at the time L changed from 0 to 1. Thus, $Q_t=D_t$ if L=0 and $Q_{t+1}=Q_t$ if L=1. The signal has been latched in the latter case.

Figure 2A:
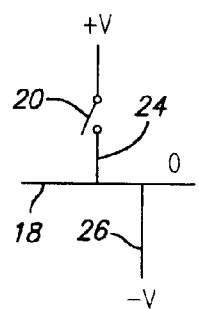
FIGS. 2a–2b are schematic drawings, depicting how to go from a conventional switch representation to a conventional voltage representation.
Figure 2B:
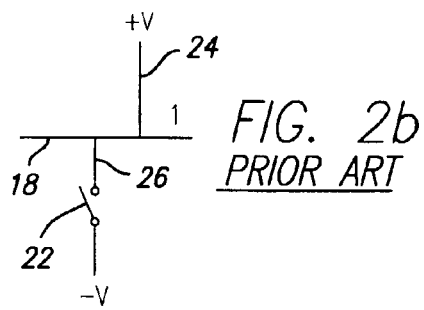

The essential functionality that one must have in order to build a latch is to be able to go back and forth between a voltage representation of a logic value (logic) and a switch representation of a logic value (memory). FIGS. 2a–2b show how to go from a switch representation to a voltage representation. Clearly, the given signal line 18 can be set to either a 0 or a 1 by using two control switches 20, 22, one of which connects to a line 24 which pulls up and the other which connects to a line 26 which pulls down. If the switch 22 that pulls down is closed, and the other switch 20 is open, then there will be a 0 on the signal line 18. If the switch 20 that pulls up is closed, and the other switch 22 is open, then there will be a 1 on the signal line 18. The logic value of the switches 20, 22 has been transferred to the voltage representation of a logic value on the signal wire 18.

Figure 3:
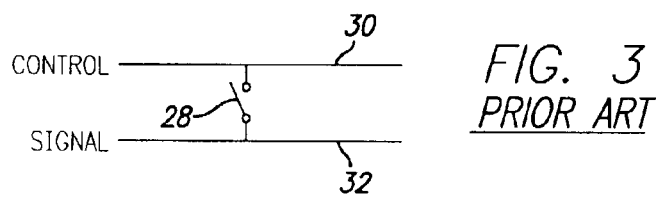
FIG. 3 is a schematic drawing, depicting how to go from a conventional voltage representation to a conventional switch representation.

FIG. 3 shows the essential method that can be used to go from voltage representation to switch representation. This a crossbar switch, comprising a switch 28 at the junction of two crossed wires 30, 32, and one can either open or close a switch based on the voltage difference of the control line 30 and the signal line 32. (The wires 30, 32 appear to be in the same plane, but, in reality, one crosses the other at some non-zero angle, typically, 90 degrees.) It is easy to use a voltage on the signal line 32 to open or close one switch 28. This is the function of setting a bit of memory in a crossbar array, as disclosed in U.S. Pat. No. 6,128,214, supra. The latch function requires that a single voltage on a signal wire 32 opens one switch 28 and closes another.

Figure 4:
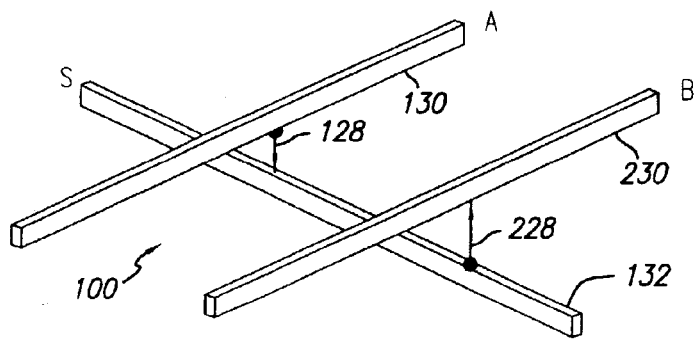
FIG. 4 is a schematic drawing, in perspective, of a latch configuration in accordance with the present invention, comprising two control lines and a signal line that form two switches.

FIG. 4 shows the physical configuration of the latch 100, in accordance with the present invention. Two control wires 130 and 230 cross a signal wire 132. The resulting nanoscale molecular junctions 128, 228 are constructed to have asymmetric and opposite connections to the signal wire 132. The asymmetry of the junctions 128, 228 is shown by the symbol for a molecular switch, which has an arrow at one end and a circle at the other.

Each junction 128, 228 may include a bi-stable molecule that is switchable from one state to another. The class of bi-stable molecules that may be repeatedly switched from one state to another and back may be employed in the practice of the present invention. Such molecules result in devices that are equivalent to RAM (random access memory) devices.

Examples of bi-stable molecules that perform switching on an electrochemical reaction (reduction-oxidation, or "redox") include the rotaxanes, pseudo-rotaxanes, catenanes, and spiropyrans. Such bi-stable molecules may be employed in the practice of the present invention.

The functionality of the asymmetric switches 128, 228 is shown in FIGS. 5a–5b. The function of opening (closing) a switch depends both on the voltage across the switch being above a threshold and on the direction of current, shown by arrow 34. If the voltage is below a threshold, then the switch will not change its state. If the voltage is above a threshold, then the switch will open if the current is in one direction or closed if the current is in the opposite direction. The convention relating the direction of current (from high voltage to low voltage) to the physical direction of the asymmetric switch is shown in FIGS. 5a–5b. In FIG. 5a, the direction of the current 34 is in the same direction as the asymmetric switch 128. If the voltage is above threshold, then this will cause the switch 128 to open. Conversely, in FIG. 5b, the direction of the current 34 is in the opposite direction as the asymmetric switch 228. If the voltage is above threshold, then this will cause the switch 228 to close.

FIG. 6 illustrates the voltage levels in the system needed to understand the operation of the latch 100. The energy levels shown are based on the difference in voltage between the signal line 32 and the control line 30. The most positive voltage will open the switch 28. Below that are a strong 1, which is the initial value of a logic 1, and a weak 1 which is the lowest value to which a logic 1 is permitted to degrade. Correspondingly, there is a weak 0, a strong 0, and a most negative voltage which will close the switch 28. The relative order of these voltages allows the latch 100 to function.

FIG. 6a shows an unconditional open pulse 36 and an unconditional close pulse 38. These are effective independent of the voltage on the signal line 32, as long as the signal line has a legal logic value between strong 1 and strong 0. The pulse 36 shows that if the control line 30 goes sufficiently positive in absolute voltage relative to ground, then the voltage difference across the junction reaches the voltage to "open" independent of the signal line voltage. The pulse 38 shows that the switch 28 will be unconditionally closed if the control line 30 goes sufficiently negative relative to ground, again, independent of the signal line voltage as long as the signal line has a legal (between logic 0 and logic 1) voltage. This is exactly the method used to set or reset bits for use in memory or to define a programmable logic function.

The interesting variation, which is at the heart of the present invention, is that one can create conditional open or close pulses as shown in FIG. 6b. The pulse 136 in FIG. 6b is a conditional open pulse. If the value on the signal line 32 is a weak 1 or a strong 1, then the switch 28 will open. If the value is a weak 0 or strong 0, then the switch 28 will not open because there will be insufficient voltage across the switch to open it. The pulse 138 is a conditional close pulse. Only if the value on the signal line is a 0 will the switch 28 close.

The latch 100 works because the switch forms an asymmetric tunnel junction. The asymmetric molecular switch junction may be switched with either conditional (latching) pulses or unconditional pulses. The direction of current flow 34 through the device in one direction is considered to be "net oxidizing", whereas in the opposite direction, it is considered to be "net reducing"; see FIGS. 5a–5b. The molecular junction is characterized by a sharp, analytical oxidizing switching voltage to close, called herein "VM". All switches are unconditionally opened prior to the start of calculation. The logic output wire has a variable signal VS1 or VS0, representing either a 1 or a zero, respectively. Referring to FIG. 4, on the signal wire 132 and on the control wires 130, 230 can be put a voltage ±Vcond.

The opening and closing of the switch 28 is asymmetric with respect to the voltage bias (positive or negative) across the junction that will open or close the switch. This defines a polarity for the switch 28. If one connects two separate control lines 130, 230 to a single signal line 132 forming two junctions 128, 228, such that the polarities of the two junctions are reversed from each other with respect to the signal line, then the two junctions may be used as a latch. This latching is done by a sequence of pulses, an unconditional open pulse followed by conditional close pulses.

FIG. 7 shows how this works whether the signal line 132 is a 1 or a 0. On the left hand side, where there is a logic 0 on the signal line 132, an unconditional open pulse 36 will open the switch 28 and the subsequent conditional close pulse 138 will only close the switch if the signal is a 0. But as shown on the right two pulses 136, 38, a logic 1 voltage on the signal line 132 will result in the switch 28 being open. The pulses 136, 38 are designed such that a weak 0 can close the switch 28 but a weak 1 cannot close the switch.

FIGS. 6a, 6b, and 7 illustrate named voltage levels (close, strong 0, weak 0, weak 1, strong 1, and open) and a ground level. While the order is essential as to the named voltage levels, it will be appreciated by those skilled in this art that the ground level is relative, and its placement in these drawings is for illustration purposes only, and is not intended to thereby limit the invention.

Figure 10:
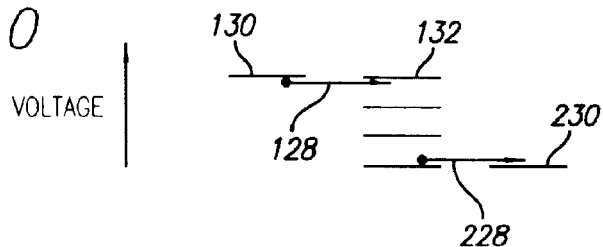
FIG. 10, on a vertical scale in volts, shows the voltage levels on the latch of FIG. 4 to restore logic values due to degradation of a signal level.

FIGS. 8–10 show the voltage levels on wires 130, 230, and 132. The voltage is in the vertical direction, with higher voltage at the top, as indicated. The direction of the asymmetric switches, between wire 132 and wires 130 and 230, is shown by the arrow and circle symbol discussed with reference to FIGS. 5a–5b. The vertical dashed lines 44 show the threshold voltage needed to open or close the switch. The four voltage levels shown for wire 132 are (from top to bottom) strong 1, weak 1, weak 0 and strong 0. FIG. 8a depicts the unconditional open condition, while FIG. 8b depicts the conditional close condition. In FIG. 8b, switch 128 is closed if wire 132 is at a 1, whereas switch 228 is closed if wire 132 is at a 0. In FIG. 9a, switch 128 is closed if wire 132 is at a 1, whereas in FIG. 9b, switch 228 is closed if wire 132 is at a 0. In FIG. 10, the logic values and latch signal are restored.

The sequence of voltages is shown in FIGS. 8–10. A sequence of three or four separate pairs of voltages results in the value that was initially on the signal line being restored to its full logic value, and kept on the signal line indefinitely. By "voltage pair" is meant the voltages on the two control lines 130, 230.

The voltage sequence has three steps:
(1) Unconditionally open both 128 and 228 switches (FIG. 8a).
(2) Conditionally close switch 128 if S=1; conditionally close switch 228 if S=0 (FIG. 8b).
(3) Connect wire 130 to logic 1 voltage level (FIG. 9a); connect wire 230 to logic 0 voltage level (FIG. 9b).

Step 2 may be done simultaneously for both switches as shown in FIG. 8b. Alternatively, Step 2 may be done in two consecutive sub steps as shown in FIG. 9a and 9b, where switch 128 is closed and then switch 228 is closed. This has the advantage that the closing of switch 128 cannot disturb the logic value on wire 132 and thus accidentally close both switches 128 and 228. Specifically, when switch 128 is conditionally closed, then the state of switch 228 is left unchanged by applying a voltage on control wire 230 that is insufficient to change the state of switch 228 (FIG. 9a). Further, when switch 228 is conditionally closed, then the state of switch 128 is left unchanged by applying a voltage on control wire 130 that is insufficient to change the state of switch 128 (FIG. 9b). Thus, switch 228 will not change its state during the first sub step, and switch 128 will not change its state during the second sub step regardless of whether switch 228 closes or not.

The present invention also provides a logic inversion function. In the last step (3), if one reverses which wire is pulled up and which wire is pulled down by choosing to reverse the voltages, then one can invert a signal by latching it. By setting wire 130 to a strong logic 0 voltage and wire 132 to a strong logic 1 voltage in step 3, the signal will be inverted.

FIG. 10 shows that a latch can also be used to restore a logic voltage level. If the signal level representing logic 1 becomes degraded due to noise, resistive losses, or diode drops, then the voltage may be restored to the fully correct signal level after it has been latched.

Figure 11:
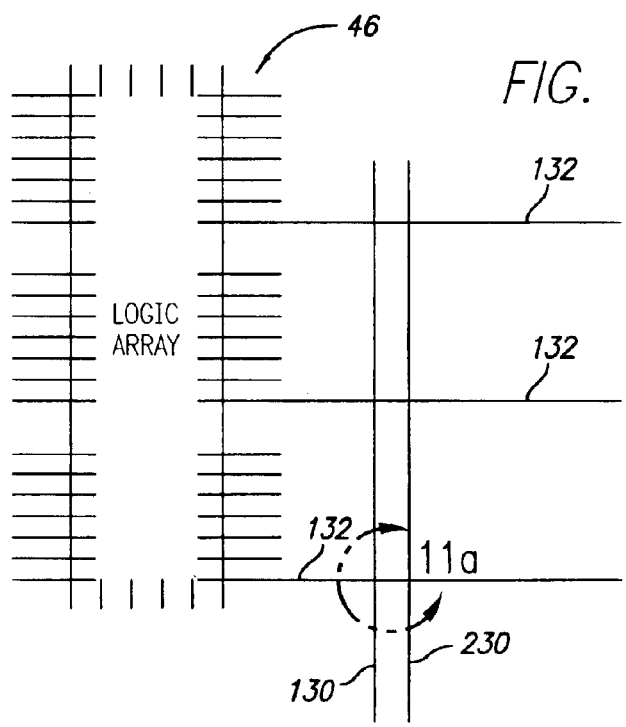
FIG. 11 depicts the use of a single pair of latch lines of the present invention to control many latches and thereby latch separate logic values onto a large number of nanowires at the same time.
Figure 11A:
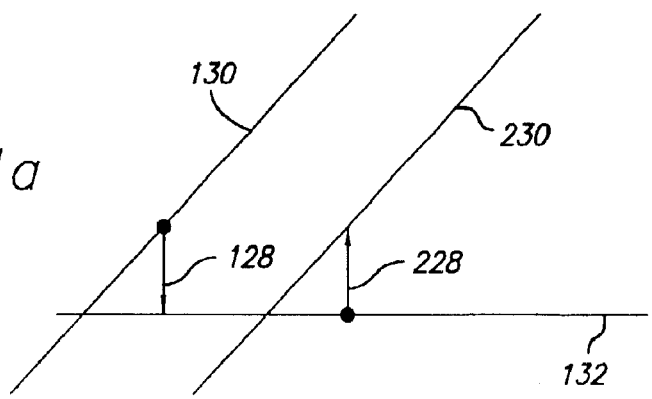
FIG. 11a is an enlargement of a portion of FIG. 11.

As shown in FIGS. 11 and 11a, the present invention has the particular advantage that the two latch control lines 130, 230, which must be driven by conventional circuitry outside the nanoscale circuit, can be reused for a large number of logic signal lines 132. A single pair of latch lines 130, 230 control many latches. Two control lines 130, 230 can be used to latch separate logic values onto a large number of nanowires in a logic array 46 at the same time. This is very efficient in terms of the number of connections to the outside world.

Controlled Input

Figure 12:
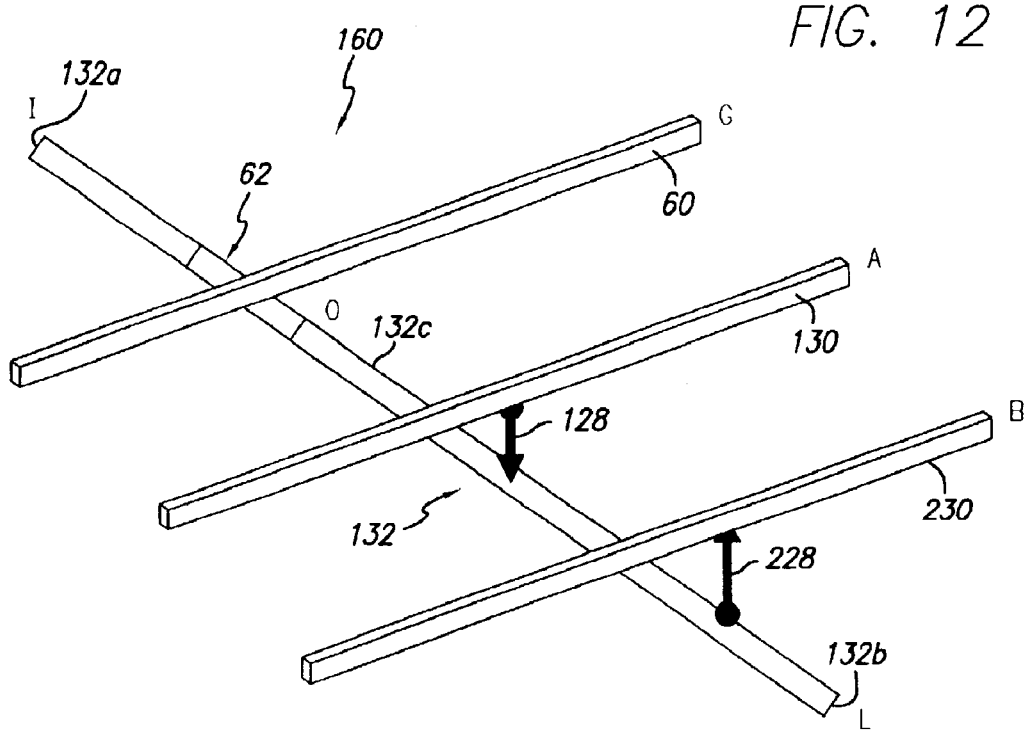
FIG. 12 is a schematic drawing, in perspective, similar to FIG. 4, of a latch configuration in accordance with the present invention, comprising two control wires and a signal wire that form two switches, together with a signal control circuit, an input, and a gate wire.

In many applications of a latch, it is desirable to be able to change the logic value of the input to the latch after the signal is latched while retaining the latched value. FIG. 12 shows how to do this using an input control circuit 160 comprising an input I 132a, an output O 132c, a gate wire 60, and a channel region 62. Control wires 130 and 230 correspond to 130 and 230 in FIGS. 4 and 11a. The region of the wire 132 extending between output O 132c to latch L 132b corresponds to signal wire 132 in FIGS. 4 and 11a. The region of the wire 132 extending between input 132a and output 132c is the controlled input.

For this controlled input case, the wire 132 must be a semiconductor. The input signal is connected to the input end I 132a of wire 132. Gate wire 60 crosses wire 132 between input 132a and output 132c and forms a channel region 62 in wire 132. This forms a field effect transistor (FET). Applying a control voltage of a first value to gate wire 60 makes channel 62 conductive and electrically connects (current can flow between) input 132a to output 132c of wire 132. Applying a control voltage of a second value to gate wire 60 makes channel 62 insulating and electrically disconnects (no current can flow between) input 132a from output 132c of wire 132. In the example of FIG. 12, output 132c is intrinsically electrically connected to the signal wire.

All of the three above functions of the latch (latching, restoration, and inverting) can be combined with the gate mechanism disclosed herein. Two sequence steps (1a) and (3') are added to the above-recited three step sequence for these functions.

Perform the six-step latch sequence:
(1) Unconditionally open both 128 and 228 switches (FIG. 8a).
(1a) Apply the first gate voltage to gate wire 60 to connect input 132a to latch 132b.
(2a) Conditionally close switch 128 if S=1.
(2b) Conditionally close switch 228 if S=0 (FIG. 8b).
(3') Apply a second gate voltage to gate wire 60 to disconnect input 132a from latch 132b.
(3) Connect wire 130 to logic 1 voltage level (FIG. 9a); connect wire 230 to logic 0 voltage level (FIG. 9b).

Alternatively, Steps (1) and (1a) may be combined in one step, or Steps (3) and (3') may be combined in one step. This reduces the number of steps at a cost of a possible brief "glitch" or incorrect value on the signal wire 132. As described above, Steps (2a) and (2b) may be done simultaneously for both switches or may be done in two consecutive sub steps (sequentially) where switch 128 is closed and then switch 228 is closed.

Where the channel region 62 is induced, it is preferred that wire 132 be of nanometer scale for ease of inducing the channel at practical gate voltages.

Figure 13:
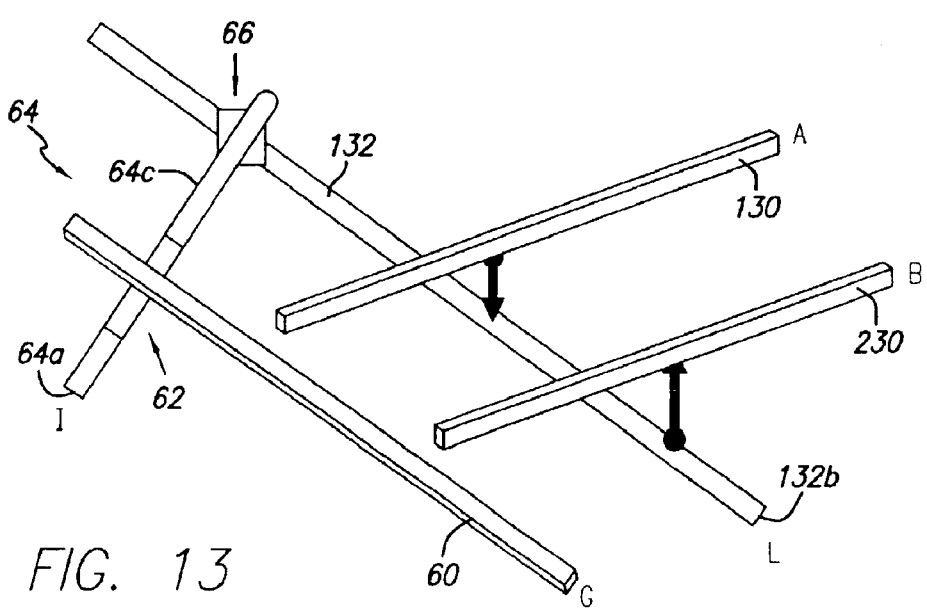
FIG. 13 is a schematic drawing, in perspective, of an alternative embodiment of the configuration of FIG. 12.

An alternative implementation of the device of FIG. 12 is shown in FIG. 13. In fact, FIG. 13 represents the general case and FIG. 12 represents the degenerate case.

Gate wire 60 crosses wire 64 between input 64a and output 64c and forms a channel region 62 in wire 64. This forms a field effect transistor (FET). Applying a control voltage of a first value to gate wire 60 makes channel 62 conductive and electrically connects (current can flow between) input 64a to output 64c of wire 64. Applying a control voltage of a second value to gate wire 60 makes channel 62 insulating and electrically disconnects (no current can flow between) input 64a from output 64c of wire 64.

In this case, the controlled input does not require that the signal wire 132 be semiconductor. It is sufficient that the gate wire 60 cross a controlled input semiconductor wire S 64 and form the channel 62 if the output 64c is electrically connected to signal wire 132. The preferred method of making such an electrical connection is through at least one junction, such as junction 66.

There are a number of ways to make electrical connections. One way is to make configurable (programmable) connections using bi-stable molecules. A preferred method of making such a connection is for junction 66 to be the molecular switch as disclosed in U.S. Pat. No. 6,314,019, entitled "Molecular-Wire Crossbar Interconnect (MWCI) for Signal Routing and Communications" and issued to Philip J. Kuekes et al on Nov. 6, 2001, and assigned to the same assignee as the present invention, the contents of which are incorporated herein by reference. Briefly, such molecular switches include a connector species at a junction of two wires (here, the controlled input wire 64 and the signal wire 132), the connector species comprising a bi-stable molecule that switches, reversibly or irreversibly, between two states based on an oxidation-reduction reaction.

Another example of making configurable connections is based on molecular systems that are based on electric-field induced band gap changes. An example of molecular systems involving electric-field-induced band gap changes is disclosed and claimed in patent application Ser. No. 09/823, 195, filed Mar. 29, 2001, which is incorporated herein by reference.

Examples of molecules used in the electric-field-induced band gap change approach include molecules that evidence:

(1) molecular conformation change or an isomerization;
(2) change of extended conjugation via chemical bonding change to change the band gap; or
(3) molecular folding or stretching.

Changing of extended conjugation via chemical bonding change to change the band gap may be accomplished in one of the following ways:

(2a) charge separation or recombination accompanied by increasing or decreasing band gap localization; or
(2b) change of extended conjugation via charge separation or recombination and π-bond breaking or formation.

Alternatively, permanent (non-programmable) connections may be employed in the practice of the various embodiments herein. An example of this approach involves the use of multi-level connections, such as generated by imprinting techniques; see, e.g., application Ser. No. 10/453, 329, filed Jun. 2, 2003, which is incorporated herein by reference. This reference includes a mold with a protruding pattern that is pressed into a thin polymer film via an imprinting process. Controlled connections between nanowires and microwires and other lithographically-made elements of electronic circuitry are provided. An imprint stamp is configured to form arrays of approximately parallel nanowires which have (1) micro dimensions in the X direction, (2) nano dimensions and nano spacing in the Y direction, and three or more distinct heights in the Z direction. The stamp thus formed can be used to connect specific individual nanowires to specific microscopic regions of microscopic wires or pads. The protruding pattern in the mold creates a recess in the thin polymer film, so the polymer layer acquires the reverse of the pattern on the mold. After the mold is removed, the film is processed such that the polymer pattern can be transferred on a metal/semiconductor pattern on the substrate.

The foregoing various connection approaches are exemplary only, and the present embodiments are not limited only to these particular connection schemes.

As contrasted with FIG. 12, where output 132c is an intrinsic connection between the controlled input 132a and the signal wire 132, the junction 66 in FIG. 13 is an explicitly constructed electrical connection between the output region 64c of the controlled input wire 64 and the signal wire 132. Here, the input signal is connected to the input end I 64a of wire 64.

Where the channel region 62 is induced, it is preferred that wire 64 be of nanometer scale for ease of inducing the channel at practical gate voltages.

Figure 14:
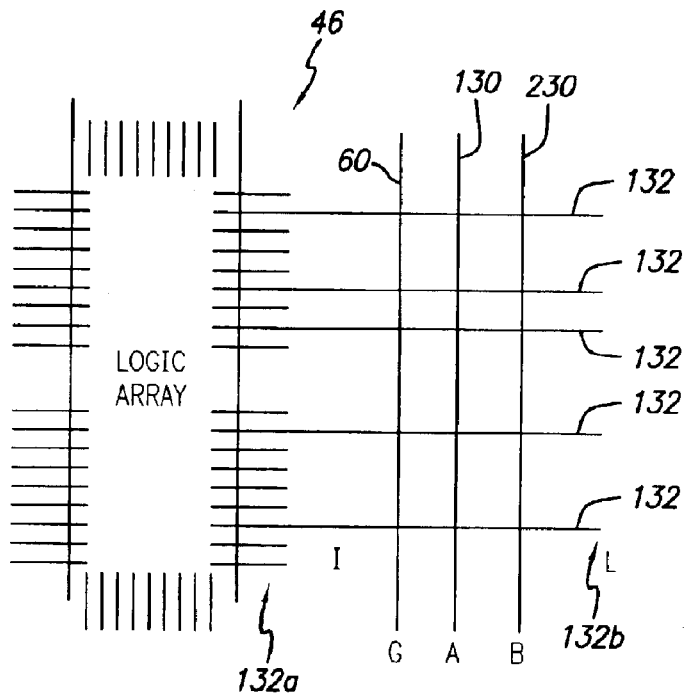
FIG. 14 is a drawing similar to that of FIG. 11, but used in conjunction with the configuration depicted in FIG. 12.

FIG. 14 is the extension of FIG. 11 to the FIG. 12 form of the gated control latch and illustrates the arrangement of the gated control latch with respect to the logic array 46. It will be appreciated that the two control wires 130, 230 and that the gate wire 60 can be used for multiple signal wires 132.

Figure 15:
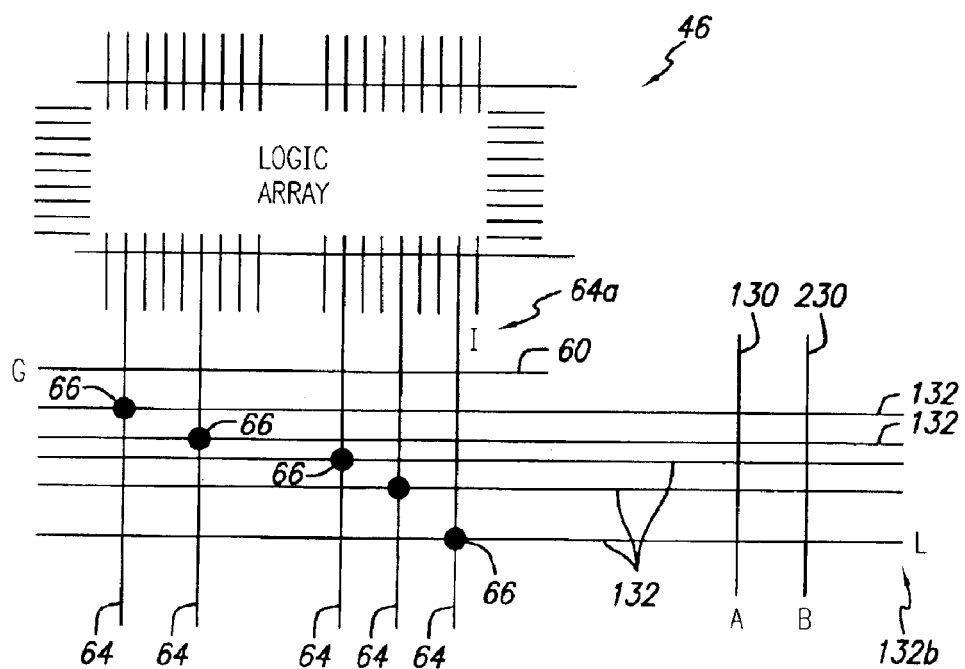
FIG. 15 is a drawing similar to that of FIG. 11, but used in conjunction with the configuration depicted in FIG. 13.

FIG. 15 is the extension of FIG. 11 to the FIG. 13 form of the gated control latch and illustrates the arrangement of the gated control latch with respect to the logic array 46. The controlled input wire 64 is physically distinct from the signal wire 132. It will be appreciated that a single gate wire 60 can handle multiple input wires 64.

Figure 16:
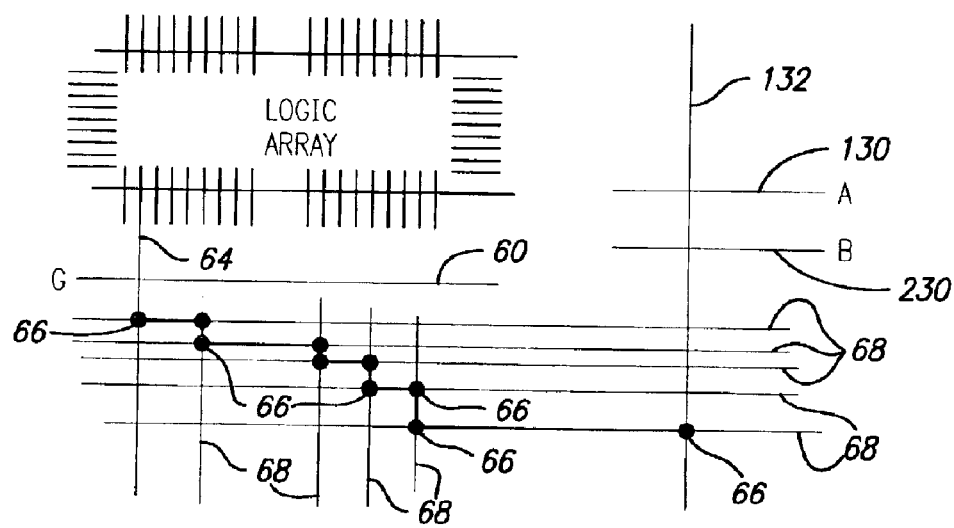
FIG. 16 is a drawing similar to that of FIG. 15, but depicting an alternate configuration.

FIG. 16 is similar to that of FIG. 15, but illustrating the case where more than one connecting wire is shown, together with the associated junctions between them. Specifically, a plurality of wires 68 (both horizontal and vertical) are shown, and a path provided by junctions 66 electrically connect the output portion 64c of the controlled input wire 64 to the signal wire 132. For clarity, the electrical path from wire 64 to wire 132 is bolded. The full generality of possible connections is more fully disclosed in the above-referenced U.S. Pat. No. 6,314,019.

In one preferred embodiment, the two control wires 130, 230, the gate wire 60, and the input control circuit all comprise wires that are of nanometer-scale diameter.

In another preferred embodiment, at least one of gate wire 60 and the two control wires 130, 230 are of micron-scale diameter, and other wires (signal wire 132, input wire 64, and connecting wires 68) are of nanometer-scale diameter.

Industrial Applicability

The molecular crossbar latch disclosed herein is expected to find use in nanoscale computing architectures. With a latch, one can construct finite state machines. A finite state machine is sufficiently powerful to in principle compute any function. Without a latch at the nanoscale, one would only have combinatorial logic, which cannot do totally general computation.

What is claimed is:

1. A molecular crossbar latch comprising two control wires and a signal wire that crosses said two control wires at a non-zero angle to thereby form a junction with each control wire, wherein each junction forms a switch and each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch, said latch further including a control mechanism for controllably electrically connecting and disconnecting signal input to said latch, thus allowing said input to change said logic value after said signal is latched while said signal wire retains its latched value.

2. The molecular crossbar latch of claim 1 wherein said control mechanism includes a gate wire and an input control circuit, with said input control circuit controlled by said gate wire, thus allowing said input to change said logic value after said signal is latched while said signal wire retains its latched value.

3. The molecular crossbar latch of claim 2 wherein the electrical connection is made via more than one junction involving at least one connecting wire.

4. The molecular crossbar latch of claim 3 wherein the electrical connection is made via a single junction formed by said input wire and said signal wire.

5. The molecular crossbar latch of claim 4 wherein an input wire is provided, comprising a semiconductor material and comprising an input portion and an output portion, said gate wire crosses said input wire at a non-zero angle between said input portion and said output portion, thereby forming a field effect transistor, and said output portion is electrically connected to said signal wire.

6. The molecular crossbar latch of claim 2 wherein said signal wire comprises a semiconductor material and crosses said gate wire at a non-zero angle to form a channel region in said signal wire where the two wires cross, thereby forming a field effect transistor.

7. The molecular crossbar latch of claim 2 wherein either (a) said two control wires, said gate wire, and said input control circuit all comprise wires that are of nanometer-scale diameter or (b) at least one of said gate wire and said two control wires are of micron-scale diameter, and all other wires are of nanometer-scale diameter.

8. A molecular crossbar latch comprising two control wires, a gate wire, an input control circuit, and a signal wire that crosses said two control wires at a non-zero angle to thereby form a junction with each control wire, wherein said input control circuit has a controllable electrical connection to said signal wire such that voltage on said gate wire determines if the input is electrically connected to the signal wire or not, wherein each junction forms a switch, and wherein each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch, thereby latching a signal on said signal wire and creating a logic value, with said input control circuit controlled by said gate wire, thus allowing said input to change said logic value after said signal is latched while said signal wire retains its latched value.

9. The molecular crossbar latch of claim 8 wherein the electrical connection is made via more than one junction involving at least one connecting wire.

10. The molecular crossbar latch of claim 9 wherein the electrical connection is made via a single junction formed by said input wire and said signal wire.

11. The molecular crossbar latch of claim 8 wherein an input wire is provided, comprising a semiconductor material and comprising an input portion and an output portion, said gate wire crosses said input wire at a non-zero angle between said input portion and said output portion, thereby forming a field effect transistor, and said output portion is electrically connected to said signal wire.

12. The molecular crossbar latch of claim 8 wherein said signal wire comprises a semiconductor material and crosses said gate wire at a non-zero angle to form a channel region in said signal wire where the two wires cross, thereby forming a field effect transistor.

13. The molecular crossbar latch of claim 8 wherein either (a) said two control wires, said gate wire, and said input control circuit all comprise wires that are of nanometer-scale diameter or (b) at least one of said gate wire and said two control wires are of micron-scale diameter, and all other wires are of nanometer-scale diameter.

14. The molecular crossbar latch of claim 8 wherein said switch is unconditionally opened by a voltage state on said signal wire denoted "strong 1" and is unconditionally closed by a voltage state on said signal wire denoted "strong 0", where said "strong 1" and said "strong 0" are both above threshold level.

15. The molecular crossbar latch of claim 14 wherein said switch is conditionally opened by a voltage state on said signal wire denoted "weak 1" and is conditionally closed by a voltage state on said signal wire denoted "weak 1", where said weak voltage states are less strong than said strong voltage states.

16. A combination of at least one connecting wire and at least one molecular crossbar latch comprising two control wires, a gate wire, an input control circuit, and a signal wire that crosses said two control wires at a non-zero angle to thereby form a junction with each control wire, wherein said input control circuit has a controllable electrical connection to said signal wire such that voltage on said gate wire determines if the input is electrically connected to the signal wire or not, wherein each junction forms a switch, and wherein each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch, thereby latching a signal on said signal wire and creating a logic value, with said input control circuit controlled by said gate wire, thus allowing said input to change said logic value after said signal is latched while said signal wire retains its latched value, wherein the electrical connection is made via more than one junction involving said at least one connecting wire.

17. The combination of claim 16 wherein the electrical connection is made via a single junction formed by said input wire and said signal wire.

18. The combination of claim 16 wherein an input wire is provided, comprising a semiconductor material and comprising an input portion and an output portion, said gate wire crosses said input wire at a non-zero angle between said input portion and said output portion, thereby forming a field effect transistor, input portion and said output portion, thereby forming a field effect transistor, and said output portion is electrically connected to said signal wire.

19. The combination of claim 16 wherein said signal wire comprises a semiconductor material and crosses said gate wire at a non-zero angle to form a channel region in said signal wire where the two wires cross, thereby forming a field effect transistor.

20. The combination of claim 16 wherein either (a) said two control wires, said gate wire, and said input control circuit all comprise wires that are of nanometer-scale diameter or (b) at least one of said gate wire and said two control wires are of micron-scale diameter, and all other wires are of nanometer-scale diameter.

21. The combination of claim 16 wherein said two control wires are electrically associated with a plurality of signal wires.

22. The combination of claim 16 wherein a single said gate wire is electrically associated with a plurality of input wires.

23. A method for latching logic values onto nanowires in a logic array, said method comprising:
providing a molecular crossbar latch comprising two control wires, a gate wire, an input control circuit, and a signal wire that crosses said two control wires at a non-zero angle to thereby form a junction with each control wire, wherein said input control circuit has a controllable electrical connection to said signal wire such that voltage on said gate wire determines if the input is electrically connected to the signal wire or not, wherein each junction forms a switch, and wherein each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch, thereby latching a signal on said signal wire and creating a logic value, with said signal control circuit controlled by said gate wire, thus allowing said input to change said logic value after said signal is latched while said signal wire retains its latched value; and
applying a sequence of voltages to said two control wires that results in setting said switches of said two junctions such that either said first switch is open and said second switch is closed if said signal wire has a voltage representing a logic 0, or said first switch is closed and said second switch is open if said signal wire has a voltage representing a logic 1.

24. The method of claim 23 wherein the electrical connection is made via more than one junction involving at least one connecting wire.

25. The method of claim 24 wherein the electrical connection is made via a single junction formed by said input wire and said signal wire.

26. The method of claim 25 wherein an input wire is provided, comprising a semiconductor material and comprising an input portion and an output portion, said gate wire crosses said input wire at a non-zero angle between said input portion and said output portion, thereby forming a field effect transistor, and said output portion is electrically connected to said signal wire.

27. The method of claim 24 wherein said signal wire comprises a semiconductor material and crosses said gate wire at a non-zero angle to form a channel region in said signal wire where the two wires cross, thereby forming a field effect transistor.

28. The method of claim 24 wherein either (a) said two control wires, said gate wire, and said input control circuit all comprise wires that are of nanometer-scale diameter or (b) at least one of said gate wire and said two control wires are of micron-scale diameter, and all other wires are of nanometer-scale diameter.

29. The method of claim 23 wherein said switch is unconditionally opened by a voltage state on said signal wire denoted "strong 1" and is unconditionally closed by a voltage state on said signal wire denoted "strong 0", where said "strong 1" and said "strong 0" are both above threshold level.

30. The method of claim 23 wherein said switch is conditionally opened by a voltage state on said signal wire denoted "weak 1" and is conditionally closed by a voltage state on said signal wire denoted "weak 1", where said weak voltage states are less strong than said strong voltage states.

31. The method of claim 23 wherein said sequence of voltages has six steps:
unconditionally open both said switches;
apply the first gate voltage to said gate wire to connect input to latch;
conditionally close said first switch if said signal wire has a logic 1 and leave the state of said second switch unchanged by applying a voltage on said control wire associated with said second switch that is insufficient to change its state;
conditionally close said second switch if said signal wire has a logic 0 and leave the state of said first switch unchanged by applying a voltage on said control wire associated with said first switch that is insufficient to change its state;
apply a second gate voltage to said gate wire to disconnect said input from latch; and
connect said control wire associated with said first switch to a logic 1 voltage level and connect said second control wire associated with said second switch to a logic 0 voltage level.

32. The method of claim 31 wherein at least one of the following actions is taken: (a) simultaneously perform the first two steps, (b) simultaneously perform the next two steps; and (c) simultaneously performing the last two steps.

33. A method for restoring a weakened voltage value of a signal to its full value in a nano-scale switch, said method comprising:
molecular crossbar latch comprising two control wires, a gate wire, an input control circuit, and a signal wire that crosses said two control wires at a non-zero angle to thereby form a junction with each control wire, wherein said input control circuit has a controllable electrical connection to said signal wire such that voltage on said gate wire determines if the input is electrically connected to the signal wire or not, wherein each junction forms a switch, and wherein each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch, thereby latching a signal on said signal wire and creating a logic value, with said signal control circuit controlled by said gate wire, thus allowing said input to change said logic value after said signal is latched while said signal wire retains its latched value;

latching said signal by applying a sequence of voltages to said two control wires that results in setting said switches of said two junctions such that either said first switch is open and said second switch is closed if said signal wire has a voltage representing a logic 0, or said first switch is closed and said second switch is open if said signal wire has a voltage representing a logic 1; and placing a voltage representing logic 1 on said first control wire and a voltage representing logic 0 on said second control wire.

34. The method of claim 33 wherein the electrical connection is made via more than one junction involving at least one connecting wire.

35. The method of claim 34 wherein the electrical connection is made via a single junction formed by said input wire and said signal wire.

36. The method of claim 35 wherein an input wire is provided, comprising a semiconductor material and comprising an input portion and an output portion, said gate wire crosses said input wire at a non-zero angle between said input portion and said output portion, thereby forming a field effect transistor, and said output portion is electrically connected to said signal wire.

37. The method of claim 34 wherein said signal wire comprises a semi-conductor material and crosses said gate wire at a non-zero angle to form a channel region in said signal wire where the two wires cross, thereby forming a field effect transistor.

38. The method of claim 34 wherein either (a) said two control wires, said gate wire, and said input control circuit all comprise wires that are of nanometer-scale diameter or (b) at least one of said gate wire and said two control wires are of micron-scale diameter, and all other wires are of nanometer-scale diameter.

39. The method of claim 33 wherein said switch is unconditionally opened by a voltage state on said signal wire denoted "strong 1" and is unconditionally closed by a voltage state on said signal wire denoted "strong 0", where said "strong 1" and said "strong 0" are both above threshold level.

40. The method of claim 33 wherein said switch is conditionally opened by a voltage state on said signal wire denoted "weak 1" and is conditionally closed by a voltage state on said signal wire denoted "weak 1", where said weak voltage states are less strong than said strong voltage states.

41. The method of claim 33 wherein said sequence of voltages has six steps:

unconditionally open both switches;

apply a first gate voltage to said gate wire to connect input to latch;

conditionally close said first switch if said signal wire has a logic 1 and leave the state of said second switch unchanged by applying a voltage on said control wire associated with said second switch that is insufficient to change its state;

conditionally close said second switch if said signal wire has a logic 0 and leave the state of said first switch unchanged by applying a voltage on said control wire associated with said first switch that is insufficient to change its state;

apply a second gate voltage to said gate wire to disconnect said input from latch;

connect said control wire associated with said first switch to a logic 1 voltage level and connect said second control wire associated with said second switch to a logic 0 voltage level.

42. The method of claim 41 wherein at least one of the following actions is taken: (a) simultaneously perform the first two steps, (b) simultaneously perform the next two steps; and (c) simultaneously performing the last two steps.

43. A method for inverting the logic value of a signal in a nano-scale switch, said method comprising:

molecular crossbar latch comprising two control wires, a gate wire, an input control circuit, and a signal wire that crosses said two control wires at a non-zero angle to thereby form a junction with each control wire, wherein said input control circuit has a controllable electrical connection to said signal wire such that voltage on said gate wire determines if the input is electrically connected to the signal wire or not, wherein each junction forms a switch, and wherein each said junction has a functional dimension in nanometers, with said signal wire selectively having at least two different voltage states, ranging from a 0 state to a 1 state, wherein there is an asymmetry with respect to the direction of current flow from said signal wire through one junction compared to another junction such that current flowing through one junction into or out of said signal wire can open or close, respectively, said switch, while current flowing through said other junction out of or into said signal wire can close or open, respectively, said switch, and wherein there is a voltage threshold for switching between an open switch and a closed switch, thereby latching a signal on said signal wire and creating a logic value, with said signal control circuit controlled by said gate wire, thus allowing said input to change said logic value after said signal is latched while said signal wire retains its latched value;

latching said signal by applying a sequence of voltages to said two control wires that results in setting said switches of said two junctions such that either said first switch is open and said second switch is closed if said signal wire has a voltage representing a logic 1, or said first switch is closed and said second switch is open if said signal wire has a voltage representing a logic 1; and placing a voltage representing logic 0 on said first control wire and a voltage representing logic 1 on said second control wire.

44. The method of claim 43 wherein the electrical connection is made via more than one junction involving at least one connecting wire.

45. The method of claim 44 wherein the electrical connection is made via a single junction formed by said input wire and said signal wire.

46. The method of claim 45 wherein an input wire is provided, comprising a semiconductor material and comprising an input portion and an output portion, said gate wire crosses said input wire at a non-zero angle between said input portion and said output portion, thereby forming a field effect transistor, and said output portion is electrically connected to said signal wire.

47. The method of claim 44 wherein said signal wire comprises a semi-conductor material and crosses said gate wire at a non-zero angle to form a channel region in said signal wire where the two wires cross, thereby forming a field effect transistor.

48. The method of claim 44 wherein either (a) said two control wires, said gate wire, and said input control circuit all comprise wires that are of nanometer-scale diameter or (b) at least one of said gate wire and said two control wires are of micron-scale diameter, and all other wires are of nanometer-scale diameter.

49. The method of claim 43 wherein said signal wire comprises a semi-conductor material and crosses said gate wire at a non-zero angle to form a channel region in said signal wire where the two wires cross, thereby forming a field effect transistor.

50. The method of claim 43 wherein a source wire is provided, comprising a semiconductor material, said gate wire crosses said source wire at a non-zero angle, and said source wire crosses said signal wire at a non-zero angle to form a connecting junction.

51. The method of claim 43 wherein said switch is unconditionally opened by a voltage state on said signal wire denoted "strong 1" and is unconditionally closed by a voltage state on said signal wire denoted "strong 0", where said "strong 1" and said "strong 0" are both above threshold level.

52. The method of claim 43 wherein said switch is conditionally opened by a voltage state on said signal wire denoted "weak 1" and is conditionally closed by a voltage state on said signal wire denoted "weak 1", where said weak voltage states are less strong than said strong voltage states.

53. The method of claim 43 wherein said sequence of voltages has six steps:

unconditionally open both said switches;

apply a first gate voltage to said gate wire to connect input to latch;

conditionally close said first switch if said signal wire has a logic 1 and leave the state of said second switch unchanged by applying a voltage on said control wire associated with said second switch that is insufficient to change its state;

conditionally close said second switch if said signal wire has a logic 0 and leave the state of said first switch unchanged by applying a voltage on said control wire associated with said first switch that is insufficient to change its state;

apply a second gate voltage to said gate wire to disconnect input from latch; and connect said control wire associated with said first switch to a logic 0 voltage level and connect said second control wire associated with said second switch to a logic 1 voltage level.

54. The method of claim 53 wherein at least one of the following actions is taken: (a) simultaneously perform the first two steps, (b) simultaneously perform the next two steps; and (c) simultaneously performing the last two steps.

* * * * *